United States Patent
Högberg et al.

(10) Patent No.: US 6,900,384 B2
(45) Date of Patent: May 31, 2005

(54) COVER FOR AN ELECTRONIC DEVICE

(75) Inventors: Mats Högberg, Partille (SE); Goran Snygg, Partille (SE); Mikael Johansson, Mölnlycke (SE); Lars Bolander, Borås (SE); Gunnar Skatt, Mölndal (SE)

(73) Assignee: Telefonaktiebolget LM Ericsson (publ), Stockholm (SE)

( * ) Notice: Subject to any disclaimer, the term of this patent is extended or adjusted under 35 U.S.C. 154(b) by 56 days.

(21) Appl. No.: 10/284,097

(22) Filed: Oct. 31, 2002

(65) Prior Publication Data

US 2004/0084196 A1 May 6, 2004

Related U.S. Application Data

(63) Continuation of application No. PCT/SE01/00127, filed on May 22, 2001.

(30) Foreign Application Priority Data

May 22, 2000 (SE) ............................................. 0001900

(51) Int. Cl.$^7$ ................................................. H05K 9/00
(52) U.S. Cl. ...................... 174/35 R; 361/818; 206/719
(58) Field of Search .......................... 174/35 R, 35 MS, 174/35 EC; 361/752, 753, 799, 800, 816, 818; 206/719, 720, 721

(56) References Cited

U.S. PATENT DOCUMENTS

| | | | |
|---|---|---|---|
| 3,836,967 A | * 9/1974 | Wright | ........................... 342/4 |
| 4,754,101 A | 6/1988 | Stickney et al. | |
| 4,825,090 A | * 4/1989 | Grabis | ..................... 250/515.1 |
| 5,304,750 A | * 4/1994 | Schubert et al. | ............ 181/294 |
| 5,548,083 A | 8/1996 | Yamamoto | |
| 5,814,761 A | * 9/1998 | Piazza | ...................... 174/35 R |
| 6,426,457 B1 | * 7/2002 | Toyoda et al. | ............ 174/35 R |

FOREIGN PATENT DOCUMENTS

| | | | | |
|---|---|---|---|---|
| JP | 02303097 A | * 12/1990 | ............ H05K/9/00 |
| SE | 511964 C2 | 12/1999 | |

* cited by examiner

Primary Examiner—Dean A. Reichard
Assistant Examiner—Carmelo Oliva
(74) Attorney, Agent, or Firm—Nixon & Vanderhye P.C.

(57) ABSTRACT

The invention relates to a cover (200,300,400,500,600) for an electronic device (100), which electronic device comprises a substrate (110) and at least two electronic components (120,130), one of which generates an electromagnetic field around itself, where the cover has a first main surface (210) that faces towards the electronic device, comprises a material that conducts current, and is designed and arranged in such a way in relation to the electronic components that a cooling medium can pass from the first (120) to the second (130) electronic component. The invention is characterized in that, by virtue of its shape and its material content, the cover has been given an increased ability to absorb at least part of the electromagnetic field that is generated by at least one of the electronic components. Part of the increased absorbing ability has been achieved by the first main surface of the cover having a shape that minimizes the number of parallel surfaces between the electronic device and the first main surface. The cover can suitably have a number of conical protrusions protruding in the direction towards the electronic components (120,130).

12 Claims, 2 Drawing Sheets

COVER FOR AN ELECTRONIC DEVICE

This application is a continuation of PCT/SE01/00127, filed on May 22, 2001, claiming priority from Swedish application SE 0001900-0, filed on May 22, 2000.

TECHNICAL FIELD

This invention relates to a cover for an electronic device, in particular an electronic device with components in the microwave range. The invention reduces the electromagnetic interference between the components, without impairing the possibility of good cooling of the components.

CURRENT TECHNOLOGY

Increased miniaturization and integration of radio and microwave components in electronic devices means that the components are placed increasingly closer to each other which, due to electromagnetic fields that the components generate around themselves, results in increased problems with crosstalk and unwanted connections between the components, which can lead to a number of different problems, for example spurious signals and self-oscillation.

There are a number of known solutions for avoiding the problem described above. The most common is to reduce the circuit integration, in other words to place the circuits a greater distance apart, which makes the miniaturization of the circuit or the components in question more difficult. Another solution is to encapsulate the components in various ways in various types of screening materials, which increases the cost, puts restrictions on performance and, in addition, makes the cooling of the device more difficult. This encapsulation can be located either on the same surface as the components, or on a cover that is attached above the surface on which the components are arranged, in which case screening walls protrude towards the components and enclose them.

SUMMARY

The problem that is solved by the present invention is thus to produce a device to counteract crosstalk and unwanted connections between components in an electronic device, caused by electromagnetic fields that at least one component generates around itself. Crosstalk and unwanted connections are to be counteracted, while at the same time cooling of the device must not be made more difficult.

This problem is solved by the invention by means of a cover for an electronic device, which electronic device comprises a substrate and at least two electronic components, at least one of which generates an electromagnetic field around itself. The cover has at least one first main surface that faces towards the electronic device, comprises a material that conducts current, and is designed and arranged in such a way in relation to the electronic components that a cooling medium can pass from the first to the second electronic component. By means of its shape and its material content, the cover has been given an increased ability to absorb at least part of the electromagnetic field that is generated by at least one electronic component. As the cover absorbs at least part of the electronic field, crosstalk and unwanted connections are reduced.

A suitable way of providing the cover with part of its increased absorbing ability is to give the cover's first main surface an irregular shape that minimizes the number of parallel surfaces between the electronic device and the first main surface. This can be suitably carried out by the cover being provided with a number of either conical or pyramidal protrusions, protruding in the direction of the electronic components.

BRIEF DESCRIPTION OF THE FIGURES

In the following, the invention will be described in greater detail with reference to the attached figures, in which.

DETAILED DESCRIPTION

Figure 1:
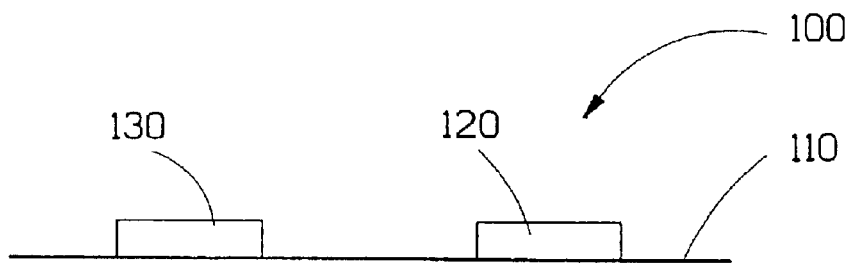
FIG. 1 shows an electronic device on which a cover in accordance with the invention can be used.

FIG. 1 shows schematically an electronic device 100 on which the invention can be used. The electronic device 100 comprises a substrate 110, and two electronic components 120,130 arranged on the substrate. The substrate 110 can, for example, be a so-called MCM, Multi Chip Module, in which case the electronic components 120, 130 can suitably be passive components or so-called MMICs, Monolithic Microwave Integrated Circuits, which are a type of active microwave circuit. The electronic components are suitably, but not necessarily, connected to each other via conductor paths on the substrate.

As components are often placed extremely close to each other on an MCM, unwanted connections can arise between the components if either or both of the components generate an electromagnetic field around themselves, which is a common phenomenon. These unwanted connections can give rise to a number of different negative phenomena, for example crosstalk, spurious signals and self-oscillation. The electromagnetic field can also spread to other electronic devices, for example circuit boards and the like, which are arranged in the vicinity of the electronic device.

Figure 2:
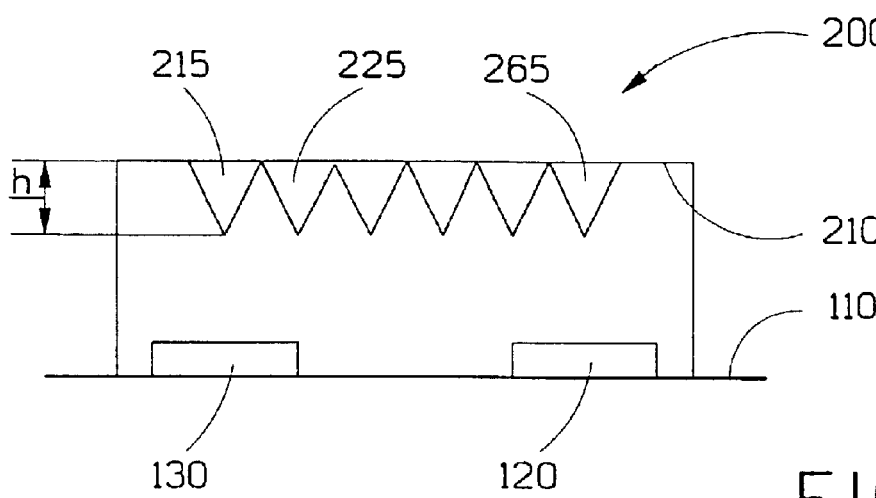
FIG. 2 shows an embodiment of the invention.

FIG. 2 shows an example of a cover 200 according to the invention, arranged in association with an electronic device similar to the one in FIG. 1. In the example in FIG. 2, the cover 200 is arranged at a distance from the substrate 110 of the electronic device and from the electronic components 120,130 and has a first main surface 210 that faces towards the electronic components. In the example, the substrate 110 is shown as essentially flat, with its main extent transversely and longitudinally, and the cover 200 is arranged essentially parallel to the substrate 110 of the electronic device. These shapes of substrate and cover are, however, not essential for the invention. For example, a curved substrate could have a cover with a corresponding shape, or, providing poorer function, a flat cover.

The function of the cover 200 is to absorb all or parts of the electronic field generated by the electronic components 120,130, while at the same time the cover does not prevent cooling medium from being able to pass between the components. In order to fulfil its function, the cover has been given a special shape and a special material content. Concerning the material content, the cover can comprise a large number of different materials, at least one of which should conduct current in order to be able to absorb parts of the electronic field. An example of a material composition that provides good function at low cost is carbon-containing plastic, where the carbon content should be around 20%. This material results in a low cost, as the material is commercially available for various electronics applications.

The material content means, as stated, that the cover according to the invention is able to absorb an electromagnetic field, and according to the invention the cover is also given a shape that increases this effect. In order to achieve its purpose, this shape should be irregular in a way that minimizes the number of parallel surfaces between the electronic device and the first main surface of the cover. An example of such a shape is shown in FIG. 2, where the cover has been provided with a number of conical protrusions, 215–265, protruding towards the electronic components 120, 130. These protrusions preferably cover the whole of the part of the cover that faces towards the electronic components, and in order to achieve the best effect the height h of the protrusions should be 0.25 $\lambda$, where $\lambda$ is the middle wavelength in air for the wavelength range in which the electronic device is intended to be used. The height of a protrusion is defined here as the perpendicular distance from the base of the protrusion to its tip, shown by the arrow h in FIG. 2.

In order not to impair the cooling of the electronic device, the cover should be arranged at such a distance from the device that this dimensioning of the height of the protrusions can be retained without the protrusions making contact with the components or the substrate of the electronic device.

Figure 3:
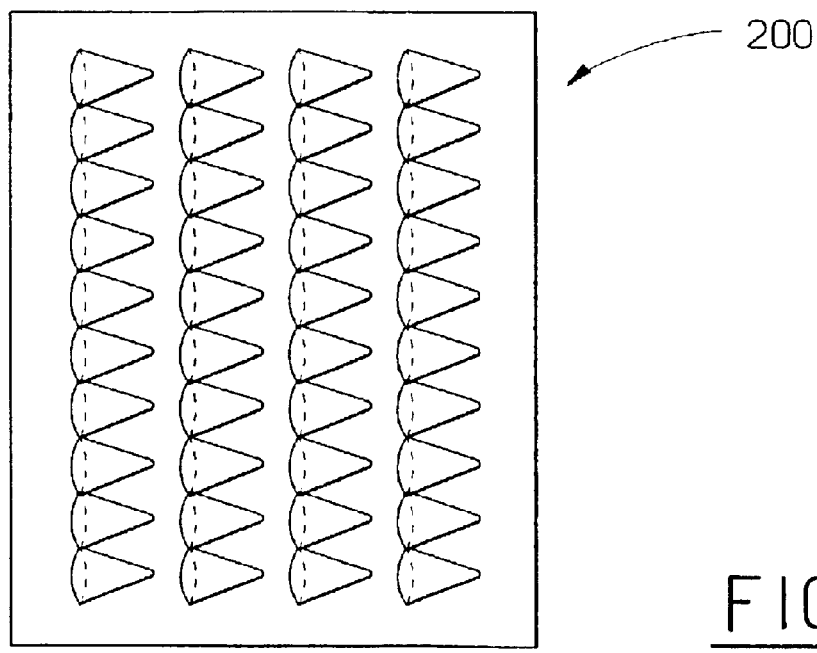
FIG. 3 shows the cover from FIG. 2 from a different angle.

FIG. 3 shows the cover 200 in FIG. 2 from a different angle, showing clearly how the protrusions cover the part of the cover that faces towards the electronic components.

The absorbing effect of the cover can, of course, be achieved with protrusions of a great many other shapes, and nor is it necessary for all the protrusions to be the same shape. As mentioned, what is important is that the protrusions reduce or minimize the number of parallel surfaces between the inside of the cover and the electronic device. An example of another shape for the protrusions that provides good functionality is that they can be pyramidal instead. However, for optimal performance the height 0.25 $\lambda$ should also be retained for cones.

The shape of the cover that has been described above is, as mentioned, intended to reduce the interference between the components in the electronic device that is caused by the electromagnetic fields generated by the components in the device. In order to reduce the interference level still further, it can be desirable also to screen the electronic device from electromagnetic fields outside the device, and conversely there can sometimes be a requirement to minimize the electromagnetic field that is emitted from the device to its surroundings. One way of designing a cover in such a way that it provides this function will now be described with reference to FIG. 4.

Figure 4:
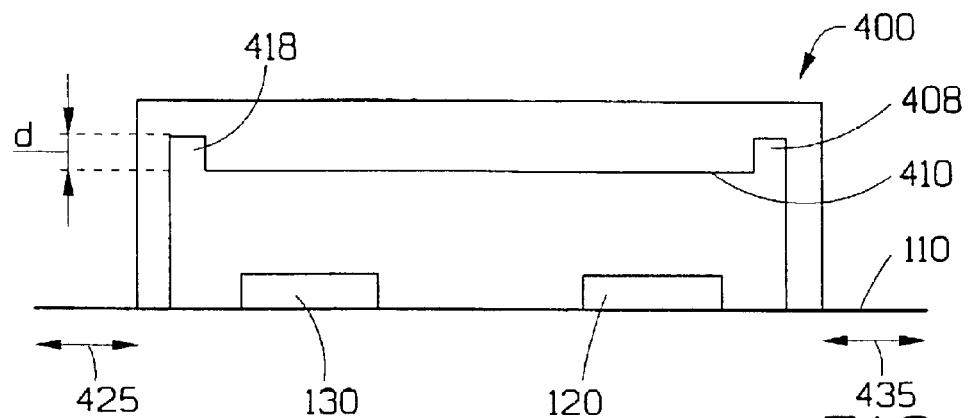
FIG. 4 shows an alternative variant of the invention.

FIG. 4 shows the same type of electronic device as the one in FIGS. 1 and 2. In the example in FIG. 4, the cover 400 is arranged at a distance from the substrate 110 of the electronic device and from the electronic components 120,130, and has a first main surface 410 that faces towards the electronic components. In the example, the substrate is shown as essentially flat, with its main extent transversely and longitudinally, and the cover 400 is arranged essentially parallel to the substrate. On both sides of the electronic components that are to have electromagnetic screening, the cover has a number of grooves 408,418 in its first main surface, which grooves provide increased electromagnetic screening between the electronic components and the surroundings. The perpendicular depth d of the grooves is suitably approximately 0.25 $\lambda$, where $\lambda$ is the wavelength for which screening is required. From this discussion, it can be seen that if the cover is provided with more than one groove on both sides of the electronic components, these can be given different depths, by means of which a screening effect covering a wider bandwidth can be obtained. Similarly, a greater number of grooves of the same depth provides a better screening effect for one and the same wavelength.

In the example in FIGS. 2 and 4 above, the cover according to the invention has been shown with two opposing walls that connect it with the electronic device. It is also possible to achieve the function without these walls, for example by arranging the cover on tracks or in some other way at the required distance from the electronic device. If the walls are included in the cover, it is also not necessary for there to be mechanical or galvanic contract between the walls and the electronic device. In an embodiment with walls, it can, however, be advantageous, in those cases where electromagnetic screening between the electronic device and its surroundings is to be achieved, if the walls are in mechanical contact with the substrate of the electronic device, in the way shown in FIG. 4. In order to increase the screening effect further, a part of the substrate can be metallized, from the point where the wall makes contact with the substrate, and outwards in the direction away from the wall, which is shown by the sections 425,435 in FIG. 4.

Figure 5:
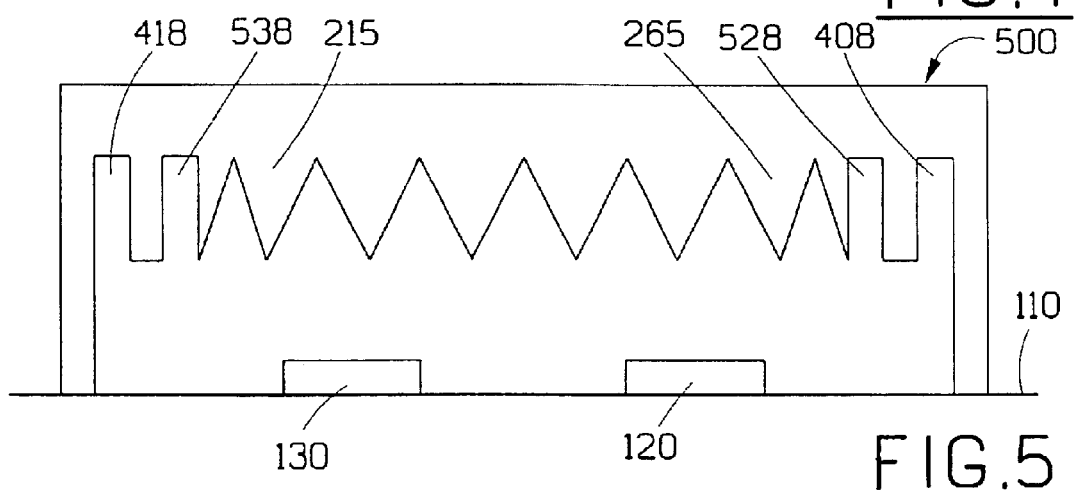
FIG. 5 shows a combination of the embodiments from FIGS. 2 and 4.

FIG. 5 shows an electronic device according to what has been described above, and a variant 500 of a cover according to the invention that provides both an absorbing and a screening effect. In this embodiment, the cover is provided on its first main surface with protrusions 215 of the kind described above in connection with FIGS. 2 and 3, and on both sides of the electronic components the cover 500 is also provided with longitudinal grooves 408,418 of the kind described in connection with FIG. 4. By means of such a cover, both an absorbing and a screening function can be achieved. In the example in FIG. 5, a cover is shown that has two grooves, 418,538 and 408,528 respectively, that are essentially parallel with each other, which, as mentioned, increases the screening effect.

Figure 6:
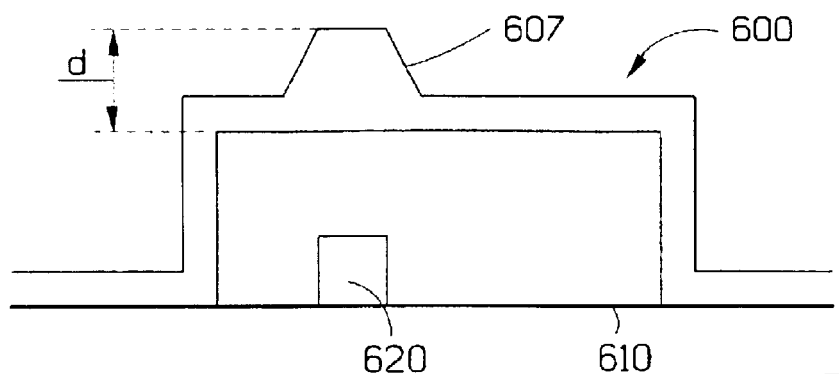
FIG. 6 shows an additional variant of the invention.

An additional variant of a cover with absorbing function is shown in FIG. 6, in which is also shown an electronic device with an electronic component 620 and a substrate 610. Opposite the electronic component 620 or other component in an electronic device that is known to generate a particularly large electromagnetic field, the cover is given a thickness of 0.25 $\lambda$, where $\lambda$ is the middle wavelength in the field that it is wished to suppress. This type of absorbing design can also be combined with the screening design from FIG. 4.

Figure 7:
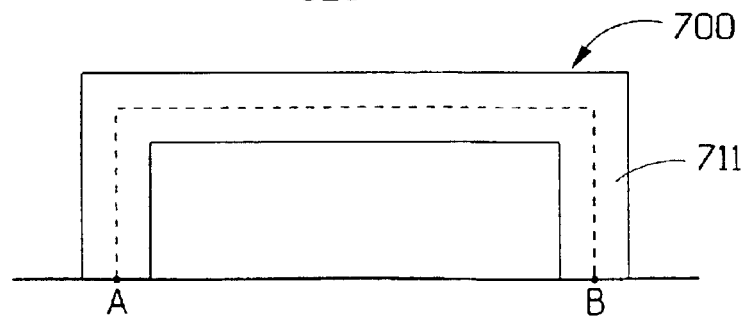
FIG. 7 shows the cover with an additional function.

Finally, FIG. 7 shows a cover 700 with an additional function, which can be freely combined with the suppressing or absorbing functions that have been described above. For the sake of simplicity, however, the cover 700 in FIG. 7 is drawn as a conventional cover. On an electronic device there are two points A and B, between which an electrical connection is to be made. Within the cover runs a so-called elastomer 711, which is a filament of plastic and/or rubber, with interwoven metal threads. This elastomer is designed and arranged in the cover in such a way that the points A and B on the electronic device, with which the cover makes contact mechanically, also make electrical contact with each other. This can, for example, be used for the transmission of electrical signals, for example RF-signals, between the points A and B, via the elastomer.

This invention is not limited to the example embodiment described above, but can be varied freely within the scope of the following patent claims.

What is claimed is:

1. A cover for an electronic device, including a substrate and at least two electronic components, at least one of which generates an electromagnetic field around itself, in which the cover has at least a first main surface that faces towards the electronic device, comprises a material that conducts current, and is designed and arranged in such a way in relation to the electronic components that a cooling medium can pass from the first to the second electronic component, which cover, by virtue of its shape and material content, has been given an increased ability to absorb at least a part of the electromagnetic field that is generated by at least one of the electronic components, wherein the cover has been given some of its increased absorbing ability by virtue of the first main surface of the cover, including parts that comprise the conducting material, having been given an irregular shape that minimizes the number of parallel surfaces between the electronic device and the first main surface, wherein the cover further includes recesses into the first main surface which provide increased electromagnetic screening between the electronic device and the surroundings.

2. Cover according to claim 1, which has a number of conical protrusions protruding in the direction towards the electronic components.

3. Cover according to claim 2, in which the height of the protrusions is 0.25 $\lambda$, where $\lambda$ is the middle wavelength in air for the wavelength range in which the electronic device is intended to be used.

4. Cover according to claim 1, which has a number of pyramidal protrusions protruding in the direction towards the electronic components.

5. over according to claim 1, in which at least one of the recesses has a depth of approximately 0.25 $\lambda$, where $\lambda$ is the middle wavelength in air for the wavelength range in which the electronic device is intended to be used.

6. Cover according to claim 1, which has a recess on opposite sides of the electronic components that the electronic device comprises.

7. Cover according to claim 1, wherein the cover includes an array of multiple solid shapes.

8. Cover according to claim 7, wherein at least one of the multiple solid shapes is conically-shaped.

9. Cover according to claim 7, wherein at least one of the multiple solid shapes is pyramidally-shaped.

10. Cover according to claim 7, wherein at least one of the multiple solid shapes includes only surfaces that are non-parallel to the electronic device.

11. Cover according to claim 7, wherein the array covers substantially all of the first main surface.

12. Cover according to claim 7, wherein the solid shapes are spaced closely together so that they abut each other to minimize exposure of portions of the first main surface parallel to the electronic device.

* * * * *